United States Patent
Usami

(10) Patent No.: US 8,466,055 B2
(45) Date of Patent: Jun. 18, 2013

(54) SEMICONDUCTOR DEVICE AND METHOD OF MANUFACTURING SEMICONDUCTOR DEVICE

(75) Inventor: Tatsuya Usami, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/589,712

(22) Filed: Aug. 20, 2012

(65) Prior Publication Data

US 2012/0315751 A1  Dec. 13, 2012

Related U.S. Application Data

(62) Division of application No. 12/662,335, filed on Apr. 12, 2010, now Pat. No. 8,274,155.

(30) Foreign Application Priority Data

Apr. 24, 2009  (JP) .................................. 2009-106384

(51) Int. Cl.
*H01L 23/48* (2006.01)
*H01L 21/768* (2006.01)

(52) U.S. Cl.
USPC .... 438/619; 257/773; 257/774; 257/E23.145; 257/E23.151; 257/E21.546

(58) Field of Classification Search
USPC ................. 257/773, 774, E23.145, E23.151, 257/E21.546; 438/619
See application file for complete search history.

(56) References Cited

U.S. PATENT DOCUMENTS

| | | | |
|---|---|---|---|
| 7,635,646 B2 | 12/2009 | Omoto et al. | |
| 2004/0063305 A1 | 4/2004 | Kloster et al. | |
| 2005/0037604 A1 | 2/2005 | Babich et al. | |
| 2007/0111508 A1* | 5/2007 | Hayashi et al. | 438/622 |
| 2008/0076258 A1 | 3/2008 | Chen et al. | |
| 2008/0197500 A1 | 8/2008 | Yang et al. | |
| 2008/0299766 A1 | 12/2008 | Omoto et al. | |
| 2009/0001594 A1 | 1/2009 | Yoo et al. | |
| 2009/0115061 A1* | 5/2009 | Chen | 257/751 |

FOREIGN PATENT DOCUMENTS

| | | |
|---|---|---|
| JP | 2008-205458 A | 9/2008 |
| JP | 2008-300652 A | 12/2008 |

OTHER PUBLICATIONS

United States Office Action dated Oct. 25, 2011 in U.S. Appl. No. 12/662,335.
United States Office Action dated Feb. 14, 2012 in U.S. Appl. No. 12/662,335.

\* cited by examiner

*Primary Examiner* — Peniel M Gumedzoe
(74) *Attorney, Agent, or Firm* — McGinn IP Law Group, PLLC

(57) ABSTRACT

A method of manufacturing a semiconductor device includes forming a first insulating layer, forming a trench in the first insulating layer, forming an interconnect in the trench, forming a space between the first insulating layer and the interconnect, and disposing an upper surface of the interconnect at a position higher than an upper surface of the first insulating layer, forming an air gap in the space and forming an etching stopper film over the first insulating layer and the interconnect, forming a second insulating layer over the etching stopper film, and forming a via in the second insulating layer to be disposed over the interconnect.

15 Claims, 9 Drawing Sheets

SEMICONDUCTOR DEVICE AND METHOD OF MANUFACTURING SEMICONDUCTOR DEVICE

The present application is a Divisional Application of U.S. patent application Ser. No. 12/662,335, filed on Apr. 12, 2010 now U.S. Pat. No. 8,274,155, which is based on and claims priority from Japanese patent application No. 2009-106384, the contents of which are incorporated hereinto by reference.

BACKGROUND

1. Technical Field

The present invention relates to a semiconductor device in which an air gap is provided between an interconnect and an insulating film having the interconnect provided therein and a method of manufacturing a semiconductor device.

2. Related Art

With the reduction in size of semiconductor devices, the gap between interconnects has been reduced. When the gap between the interconnects is reduced, the capacitance between the interconnects is increased, which causes a signal delay. As an example of a technique for reducing the capacitance between the interconnects, an air gap is provided between the interconnect and an insulating film having the interconnect provided therein.

U.S. Patent Application Publication No. 2008/0076258 discloses a method as follows. When a trench for burying an interconnect is formed in an insulating film, a deteriorated layer is formed on the side wall of the trench. The deteriorated layer is removed after the interconnect is formed, thereby forming an air gap between the interconnect and the insulating film.

Japanese Unexamined Patent Publication No. 2008-300652 discloses a method as follows. First, catalytic characteristic film is formed on the bottom and the side of a trench which is filled up a Cu film to make the interconnect. Next, the catalytic characteristic film on the side of the trench is removed so as to form an air gap between the interconnect and the insulating film.

Japanese Unexamined Patent Publication No. 2008-205458 discloses a method as follows which is not a technique for forming an air gap. First, A metal cap is formed over an interconnect. Next, an surface of an insulating film having the interconnect is damaged, and the damaged surface is removed.

Inventor finds out an problem as follows. As shown in FIG. 9A, when a via 421 and an interconnect trench 422 are formed in an interconnect layer 420 that is provided on an interconnect layer 400 having an air gap 402 formed therein, the positional deviation between the via 421 and the interconnect 404 of the interconnect layer 400 occurs. An opening region 424 that is connected to an upper part of the air gap 402 is formed on the bottom of the via 421 according to the degree of the positional deviation. In the structure in which the opening region 424 is formed, as shown in FIG. 9B, when a diffusion barrier metal film 430 and a seed film 432 are formed in the via 421 and the interconnect trench 422, the diffusion barrier metal film 430 and the seed film 432 are not formed in and around the opening region 424. As a result, a void 426 is formed in an interconnect 434. Therefore, it is necessary to prevent a region that is connected to the air gap 402 from being formed on the bottom of the via 421 even when the positional deviation between the interconnect 404 and the via 421 occurs.

SUMMARY

In one embodiment of the invention, there is provided a semiconductor device including: a first insulating layer; interconnects that are provided in the first insulating layer and have an upper surface which is higher than an upper surface of the first insulating layer; air gaps that are provided between the interconnects and the first insulating layer; an etching stopper film that is formed over the first insulating layer, the air gaps, and the interconnects; a second insulating layer that is formed over the etching stopper film; and vias that are provided in the second insulating layer and are connected to the interconnects. A portion of the etching stopper film that is disposed over the air gap is thicker than another portion that is disposed over the interconnect.

When the via is formed in the second insulating layer, the second insulating layer is etched to form a connection hole, and the etching stopper film that is disposed over the bottom of the connection hole, that is, the interconnect is etched. In the above-mentioned embodiment of the invention, a portion of the etching stopper film that is disposed over the air gap is thicker than another portion that is disposed over the interconnect. Therefore, even though the positional deviation between the via and the interconnect occurs when the connection hole, serving as the via, is formed in the second insulating layer and the connection hole overlaps the air gap in a plan view, the etching stopper film disposed over the air gap is removed at the same time when the etching stopper film disposed on the bottom of the connection hole is removed. As a result, it is possible to prevent the connection between the air gap and the connection hole.

In another embodiment of the invention, there is provided a method of manufacturing a semiconductor device. The method includes: forming a first insulating layer; forming trenchs in the first insulating layer; forming interconnects in the trenchs; forming spaces between the first insulating layer and the interconnects and disposing an upper surface of the interconnect at a position higher than an upper surface of the first insulating layer; forming air gaps in the spaces and forming an etching stopper film over the first insulating layer and the interconnects; forming a second insulating layer over the etching stopper film; and forming vias in the second insulating layer so as to be disposed over the interconnects.

According to the above-mentioned embodiment of the invention, before the etching stopper film is formed, the upper surface of the interconnect is disposed at a position higher than the upper surface of the first insulating layer. Therefore, when the etching stopper film is formed, a portion of the etching stopper film that is disposed over the air gap is thicker than another portion that is disposed over the interconnect due to the step difference between the interconnect and the first insulating layer. Even though the positional deviation between the via and the interconnect occurs when the connection hole, serving as the via, is formed in the second insulating layer and the connection hole overlaps the air gap in a plan view, the etching stopper film disposed over the air gap is removed at the same time when the etching stopper film disposed on the bottom of the connection hole is removed. As a result, it is possible to prevent the connection between the air gap and the connection hole.

According to the above-mentioned embodiments of the invention, it is possible to prevent connection between an air gap and a via even though the positional deviation between the via and an interconnect occurs when a connection hole, serving as the via, is formed in the second insulating layer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
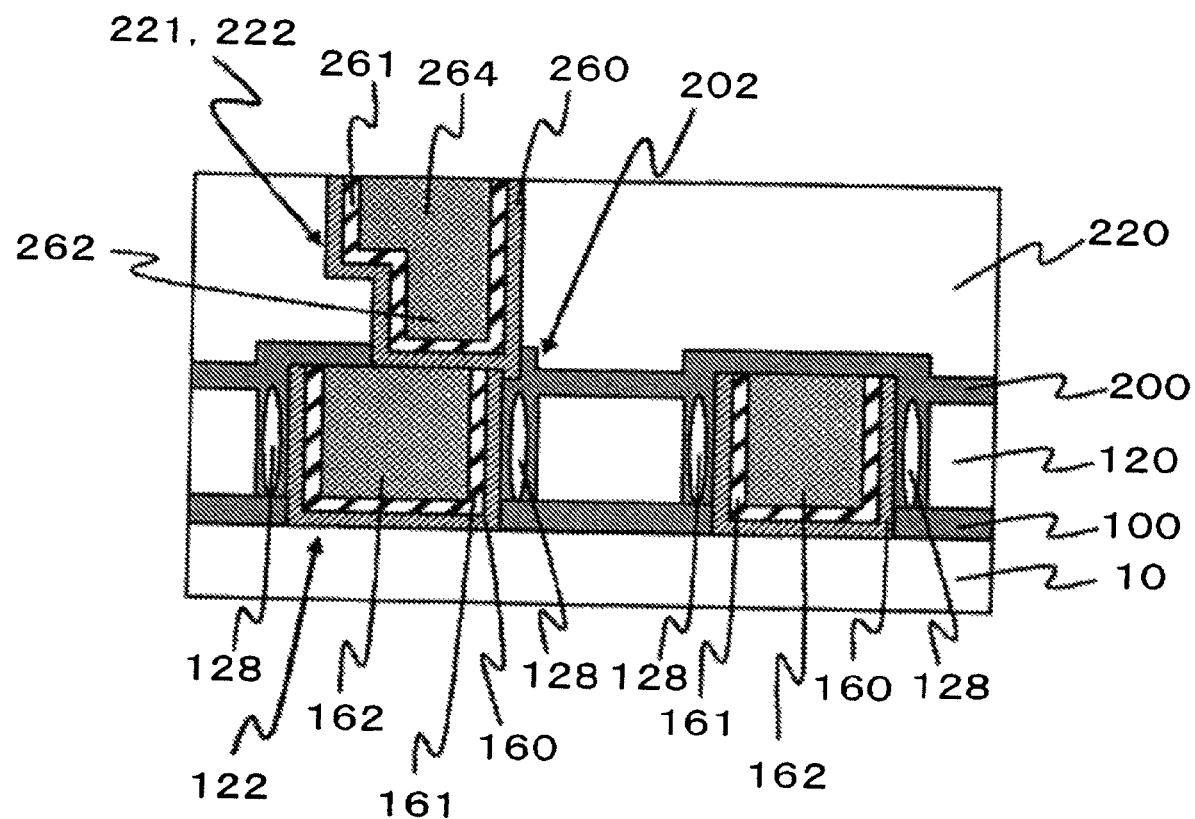
FIG. 1 is a cross-sectional view illustrating the structure of a semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and a description thereof will not be repeated.

(First Embodiment)

FIG. 1 is a cross-sectional view illustrating the structure of a semiconductor device according to a first embodiment of the invention. The semiconductor device includes a first insulating layer 120, interconnects 162, air gaps 128, an etching stopper film 200, a second insulating layer 220, and a via 262. The interconnects 162 are provided in the first insulating layer 120, and the upper surface of the interconnect 162 is higher than the upper surface of the first insulating layer 120. The air gap 128 is disposed between the interconnect 162 and the first insulating layer 120. The etching stopper film 200 is formed on the first insulating layer 120, the air gaps 128, and the interconnects 162. The second insulating layer 220 is formed on the etching stopper film 200. The via 262 is provided in the second insulating layer 220 and is connected to the interconnect 162. In the etching stopper film 200, a portion 202 that is disposed over the air gap 128 is thicker than another portion that is disposed over the interconnect 162. In the etching stopper film 200, the thick portion 202 should be formed in a region that is close to the interconnect 162 and extends in the range that is at least equal to or more than half the gap between the first insulating layer 120 and the interconnect 162 (including a diffusion barrier metal film 160, which will be described below).

In the example shown in FIG. 1, a portion of the etching stopper film 200 is buried between the interconnect 162 and the first insulating layer 120. The air gap 128 is formed in the etching stopper film 200 that is disposed between the interconnect 162 and the first insulating layer 120. However, unlike the example shown in FIG. 1, the etching stopper film 200 may not be buried between the interconnect 162 and the first insulating layer 120, but the etching stopper film 200 may be formed so as to cover the space between the interconnect 162 and the first insulating layer 120, thereby forming the air gap 128. In the example shown in FIG. 1, it is considered that this structure is likely to actually be formed.

The interconnect 162 is provided in a trench 122 that is formed in the first insulating layer 120, and the via 262 is provided in a connection hole 221 that is formed in the second insulating layer 220. A trench 222 is formed in the second insulating layer 220 so as to be disposed over the connection hole 221. An interconnect 264 that is connected to the via 262 is provided in the trench 222. In the example shown in FIG. 1, the via 262 and the interconnect 264 are formed by the same process.

The interconnect 162, the via 262, and the interconnect 264 are formed by a plating method. Specifically, the interconnect 162 includes a seed film 161. A diffusion barrier metal film 160 is formed between the seed film 161 and the trench 122. Similarly, the via 262 and the interconnect 264 include a seed film 261. A diffusion barrier metal film 260 is formed between the trench 222 and the connection hole 221, and the seed film 261. The interconnect 162, the via 262, and the interconnect 264 are, for example, Cu films. Each of the diffusion barrier metal films 160 and 260 is, for example, a multi-layer film of a TaN film and a Ta film laminated in this order.

The first insulating layer 120 and the second insulating layer 220 are low-dielectric-constant films. For example, each of the first insulating layer 120 and the second insulating layer 220 may be a SiCOH film, a SiCOHN film, or a porous film thereof. The first insulating layer 120 is formed on an etching stopper film 100. The etching stopper film 100 is formed on an underlying insulating film 10. For example, the underlying insulating film 10 is an insulating film forming an interconnect layer that is provided below the interconnect 162.

FIGS. 2A to 5B are cross-sectional views illustrating a method of manufacturing the semiconductor device shown in FIG. 1. In the method of manufacturing the semiconductor device, first, the first insulating layer 120 is formed. Then, the trench 122 is formed in the first insulating layer 120. Then, the interconnect 162 is provided in the trench 12 Then, a space is formed between the first insulating layer 120 and the interconnect 162 and the upper surface of the interconnect 162 is disposed at a position higher than the upper surface of the first insulating layer 120. Then, the space is filled up with an insulator to form the air gap 128 and the etching stopper film 200 is formed on the first insulating layer 120 and the interconnect 162. Then, the second insulating layer 220 is formed on the etching stopper film 200. Then, the via 262 that is disposed over the interconnect 162 is formed in the second insulating layer 220.

Next, the manufacturing method will be described in detail.

Figure 2A:
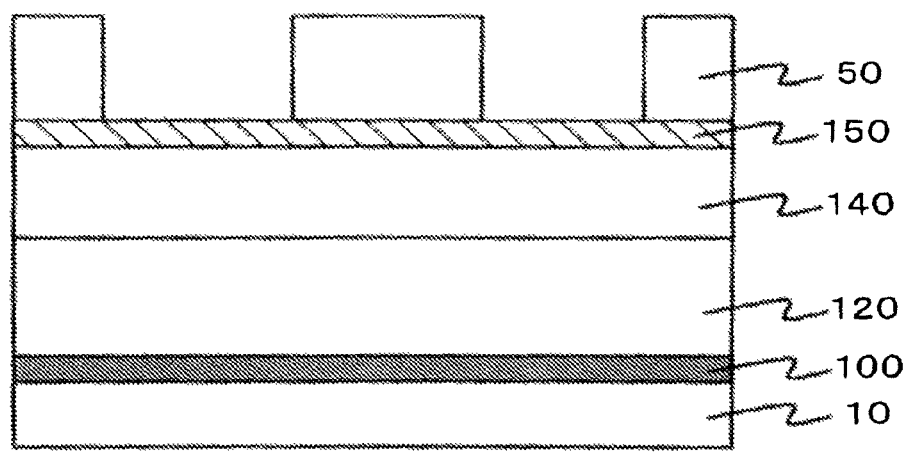
FIGS. 2A and 2B are cross-sectional views illustrating a method of manufacturing the semiconductor device shown in FIG. 1.

First, as shown in FIG. 2A, the etching stopper film 100 is formed on the underlying insulating film 10. The etching stopper film 100 is, for example, a SiCN film or a SiCNH film. However, the etching stopper film 100 may be a SiN film, a SiNH film, or a SiCOH film with high carbon concentration. The carbon concentration of the SiCOH film is higher than that of a SiCOH film forming the first insulating layer 120. For example, the carbon concentration is equal to or more than 20 at % and equal to or less than 45 at %. Then, the first insulating layer 120 and the silicon oxide layer 140 are formed on the etching stopper film 100. Then, an antireflection film 150 is formed on the silicon oxide layer 140. Then, a resist film 50 is formed on the antireflection film 150, and the resist film 50 is exposed and developed to form an opening pattern in the resist film 50.

Figure 2B:
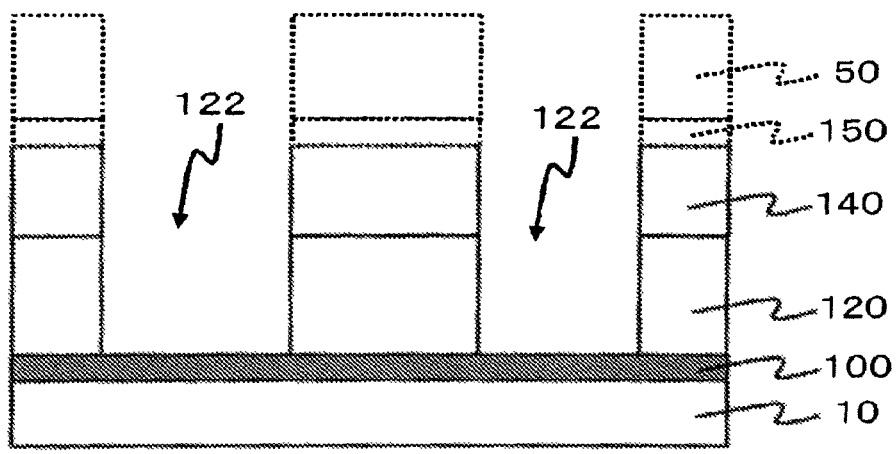

Then, as shown in FIG. 2B, dry etching is performed on the antireflection film 150, the silicon oxide layer 140, and the first insulating layer 120 using the resist film 50 as a mask. A fluorocarbon gas is used as an etching gas. In this way, the trench 122 is formed in the first insulating layer 120. Then, the resist film 50 and the antireflection film 150 are removed by plasma ashing using gas including oxygen.

Figure 3A:
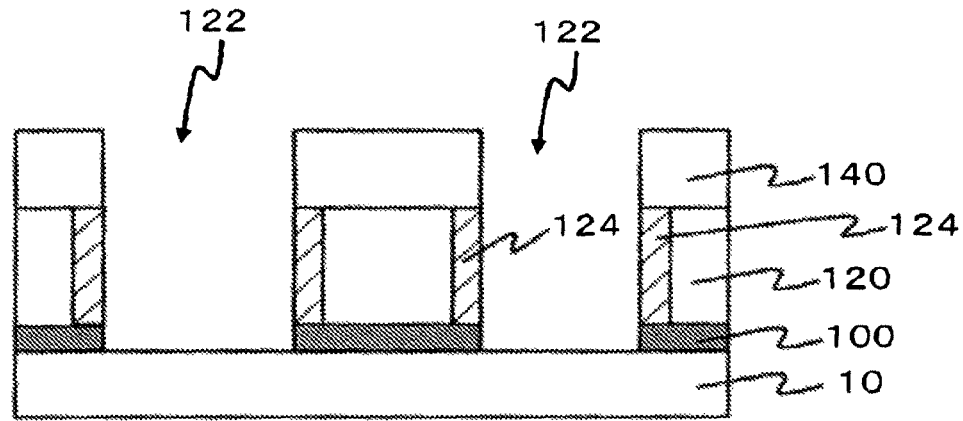
FIGS. 3A and 3B are cross-sectional views illustrating the next processes of FIGS. 2A and 2B.

Then, as shown in FIG. 3A, the etching stopper film 100 disposed on the bottom of the trench 122 is removed by dry etching. In this process, a portion of the silicon oxide layer 140 is removed. Then, the trench 122 is cleaned by a stripper for a resist film. The stripper is an amine-based solution.

In the state shown in FIG. 3A, a first damaged layer 124 is formed on the first insulating layer 120 that is disposed on the side wall of the trench 122. The first damaged layer 124 is a low carbon layer generated by a reduction in the carbon concentration of the first insulating layer 120.

Figure 3B:
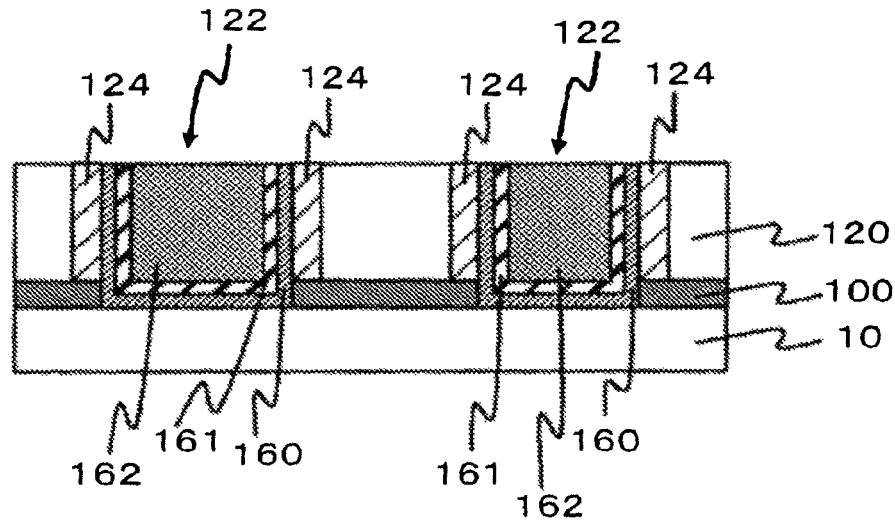

Then, as shown in FIG. 3B, the diffusion barrier metal film 160 and the interconnect 162 are provided in the trench 122. The details of this process are as follows. First, the diffusion barrier metal film 160 is formed on the bottom and the side wall of the trench 122 and on the silicon oxide layer 140 by, for example, a sputtering method. Then, the seed film 161 is formed on the diffusion barrier metal film 160 by, for example, a sputtering method. Then, plating is performed using the seed film 161 as a seed to form a conductive film. Then, the conductive film disposed over the silicon oxide layer 140, the seed film 161 disposed over the silicon oxide layer 140, the diffusion barrier metal film 160 disposed on the silicon oxide layer 140, and the silicon oxide layer 140 are removed by a chemical mechanical polishing (CMP) method. In this state, the surface of the first insulating layer 120 is exposed.

Figure 4A:
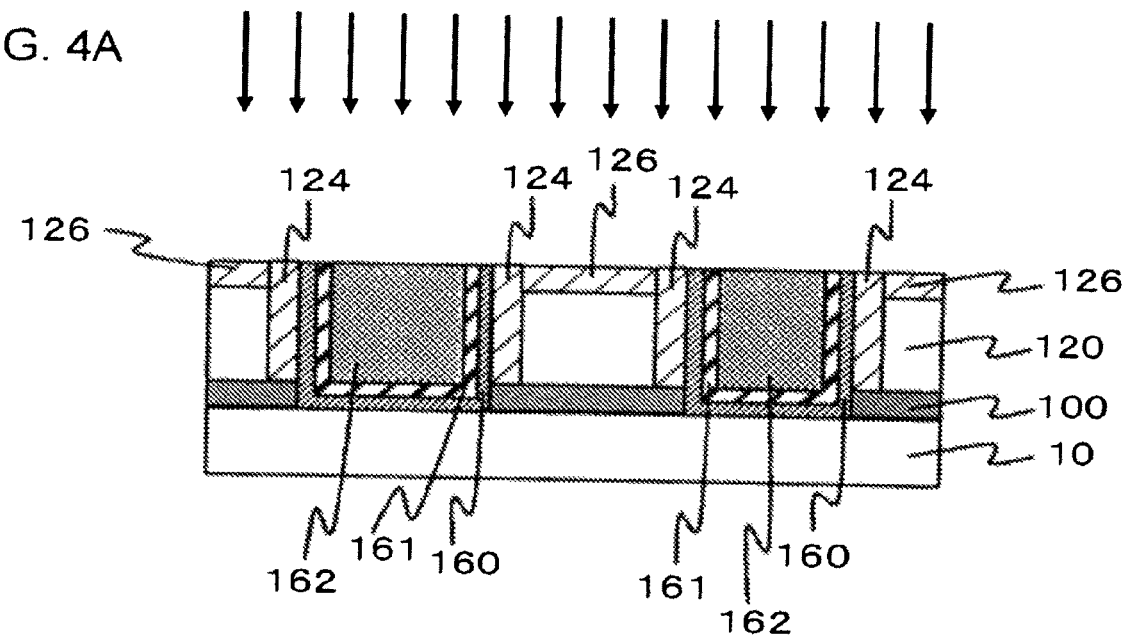
FIGS. 4A and 4B are cross-sectional views illustrating the next processes of FIGS. 3A and 3B.

Then, as shown in FIG. 4A, a second damaged layer 126 is formed on the surface of the first insulating layer 120. The second damaged layer 126 is a low carbon layer generated by a reduction in the carbon concentration of the first insulating layer 120 and is formed by, for example, processing the surface of the first insulating layer 120 with plasma including hydrogen. In this case, for example, an ammonia gas is used as at least a portion of the plasma gas.

Figure 4B:
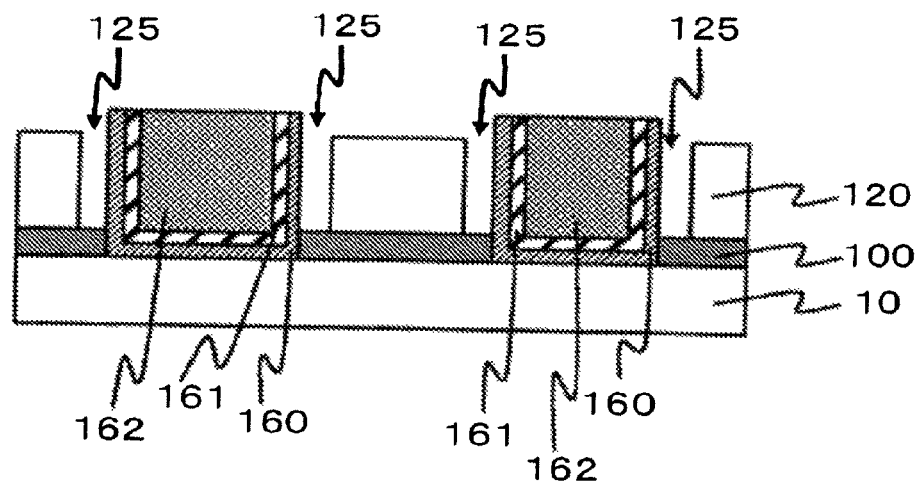

Then, as shown in FIG. 4B, the first damaged layer 124 and the second damaged layer 126 are removed by wet etching. For example, a dilute hydrofluoric acid (DHF) is used as an etchant. A space 125 is formed between the interconnect 162 and the first insulating layer 120 in the first insulating layer 120 by the above-mentioned process. In addition, the upper surface of the interconnect 162 is higher than the upper surface of the first insulating layer 120. The first damaged layer 124 and the second damaged layer 126 may be removed by dry etching.

Figure 5A:
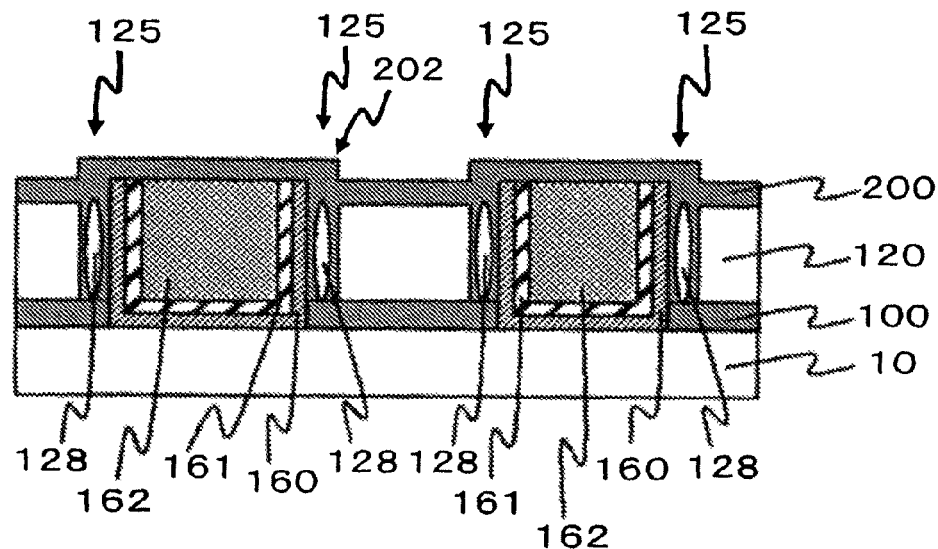
FIGS. 5A and 5B are cross-sectional views illustrating the next processes of FIGS. 4A and 4B.

Then, as shown in FIG. 5A, the etching stopper film 200 is formed on the first insulating layer 120, the space 125, and the interconnect 162. The etching stopper film 200 is, for example, a SiCN film and is formed by, for example, a plasma CVD method. The air gap 128 is formed in the space 125 by this process. In addition, a portion of the etching stopper film 200 gets into the space 125. However, the etching stopper film 200 may not get into the space 125 according to the conditions for forming the etching stopper film 200.

As described above, before the etching stopper film 200 is formed, the upper surface of the interconnect 162 is disposed at a position higher than the upper surface of the first insulating layer 120. Therefore, in the etching stopper film 200, a portion 202 that is disposed over the air gap 128 is thicker than another portion that is disposed over the interconnect 162 due to a step difference between the interconnect 162 and the first insulating layer 120.

Figure 5B:
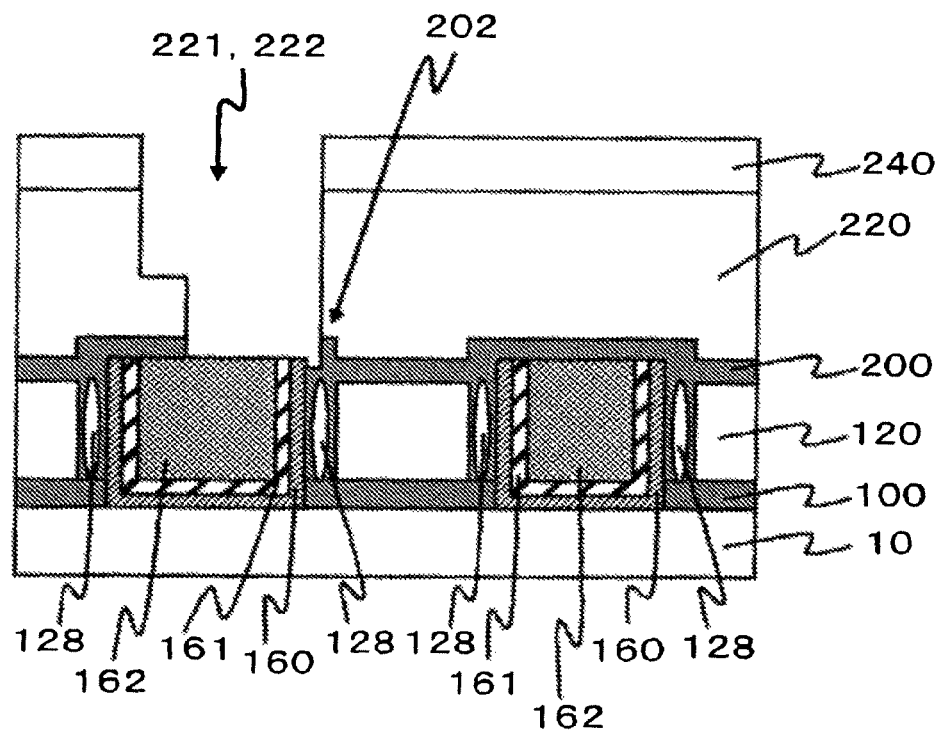

Then, as shown in FIG. 5B, the second insulating layer 220 and the silicon oxide layer 240 are formed on the etching stopper film 200, and the connection hole 221 and the trench 222 are formed in the second insulating layer 220 by, for example, a dual damascene method. The connection hole 221 is disposed over the interconnect 162. The second insulating layer 220 is, for example, a SiCOH film.

When etching is performed to form the connection hole 221, first, the second insulating layer 220 is etched using the etching stopper film 200 as a stopper. In this way, the connection hole 221 is formed in the second insulating layer 220, but the etching stopper film 200 remains on the bottom of the connection hole 221. Then, the etching stopper film 200 remaining on the bottom of the connection hole 221 is removed by etching.

In this process, as shown in FIG. 5B, the positional deviation between the connection hole 221 and the interconnect 162 occurs, which causes the connection hole 221 to overlap the air gap 128, when seen in a plan view. However, in this embodiment, the etching stopper film 200 disposed over the air gap 128 is thicker than the etching stopper film 200 disposed over the interconnect 162. Therefore, when the etching stopper film 200 remaining on the bottom of the connection hole 221 is removed, the etching stopper film 200 disposed over the air gap 128 is also removed. Therefore, the connection between the air gap 128 and the connection hole 221 is prevented.

Then, as shown in FIG. 1, the diffusion barrier metal film 260 and the via 262 are provided in the connection hole 221, and the diffusion barrier metal film 260 and the interconnect 264 are provided in the trench 222. The details of this process are as follows. First, the diffusion barrier metal film 260 is formed on the bottom and the side wall of the connection hole 221, on the bottom and the side wall of the trench 222, and on the silicon oxide layer 240 (for example, see FIG. 5B) by, for example, a sputtering method. Then, the seed film 261 is formed on the diffusion barrier metal film 260 by, for example, a sputtering method. Then, plating is performed using the seed film 261 as a seed to form a conductive film. Then, the conductive film over the silicon oxide layer 240, the seed film 261 over the silicon oxide layer 240, the diffusion barrier metal film 260 on the silicon oxide layer 240, and the silicon oxide layer 240 are removed by a CMP method.

Next, the operation and effects of this embodiment will be described. According to this embodiment, before the etching stopper film 200 is formed, the upper surface of the interconnect 162 is disposed at a position higher than the upper surface of the first insulating layer 120. Therefore, in the etching stopper film 200, the portion 202 that is disposed over the air gap 128 is thicker than another portion that is disposed over the interconnect 162 due to the step difference between the interconnect 162 and the first insulating layer 120. Even when the positional deviation between the connection hole 221 and the interconnect 162 occurs and the connection hole 221 overlaps the air gap 128 in a plan view, the etching stopper film disposed over the air gap is removed at the same time when the etching stopper film disposed on the bottom of the connection hole is removed. As a result, it is possible to prevent the connection between the air gap and the connection hole.

Therefore, it is possible to prevent the generation of a region in which the diffusion barrier metal film 260 and the seed film 261 are not formed in the side wall and the bottom of the connection hole 221. As a result, it is possible to prevent a void from being formed in the via 262.

In this embodiment, since the air gap 128 is formed by the etching stopper film 200, it is not necessary to form another film in order to form the air gap 128. Therefore, it is possible to prevent an increase in the number of processes for manufacturing a semiconductor device.

The second damaged layer 126 is formed on the upper surface of the first insulating layer 120, and the second damaged layer 126 is removed such that the upper surface of the interconnect 162 is higher than the upper surface of the first insulating layer 120. The removal of the second damaged layer 126 is performed by the same process as that for removing the first damaged layer 124 and forming the space 125 for forming the air gap 128. Therefore, it is possible to prevent an increase in the number of processes for manufacturing a semiconductor device.

The first insulating layer 120 is processed by plasma including hydrogen to form the second damaged layer 126. Therefore, when the second damaged layer 126 is formed, it is possible to prevent a damaged layer, for example, an oxide film from being formed on the surface of the interconnect 162.

(Second Embodiment)

Figure 7A:
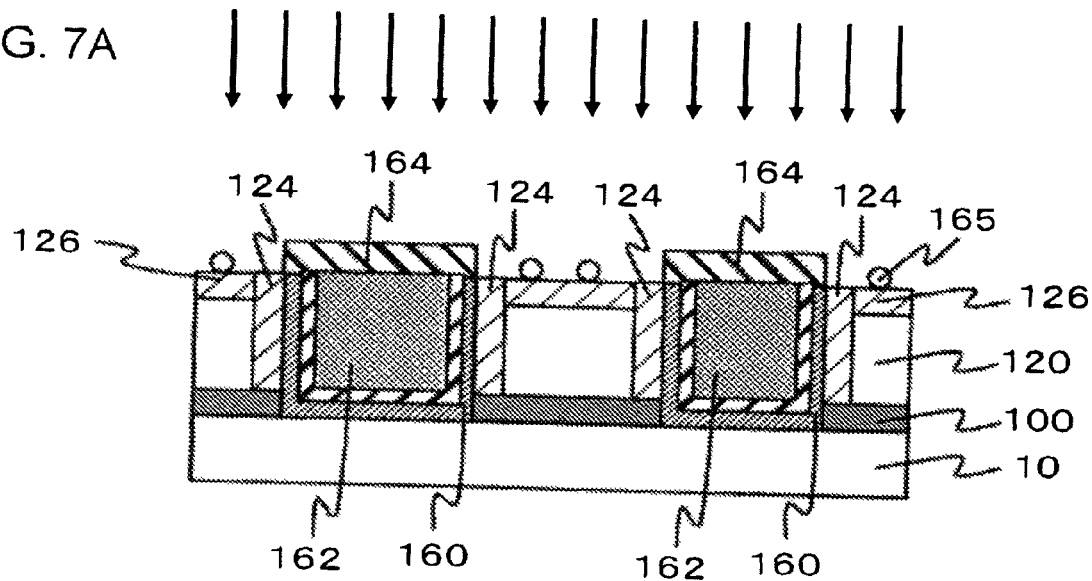
FIGS. 7A and 7B are cross-sectional views illustrating the next processes of FIGS. 6A and 6B.
Figure 7B:
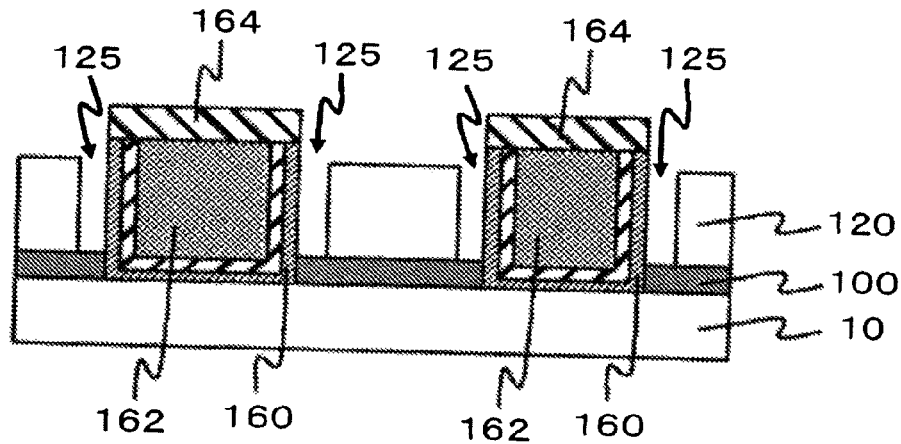
Figure 8:
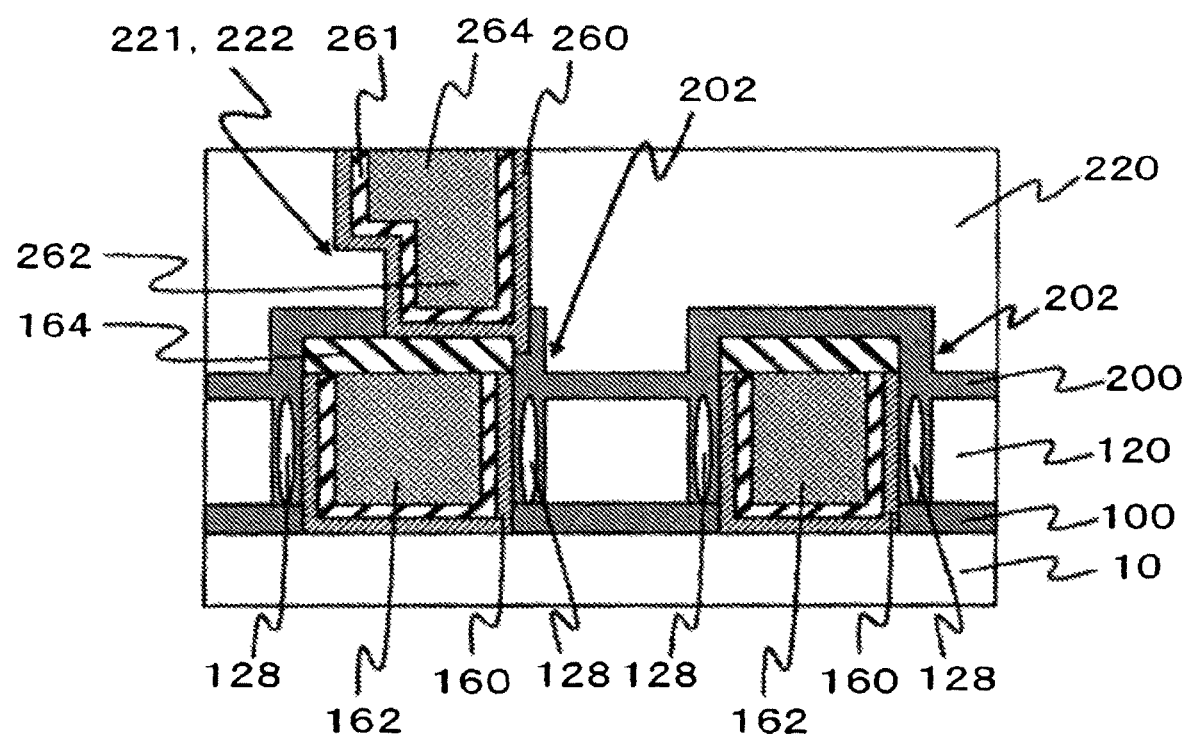
FIG. 8 is a cross-sectional view illustrating the next process of FIGS. 7A and 7B.
Figure 9A:
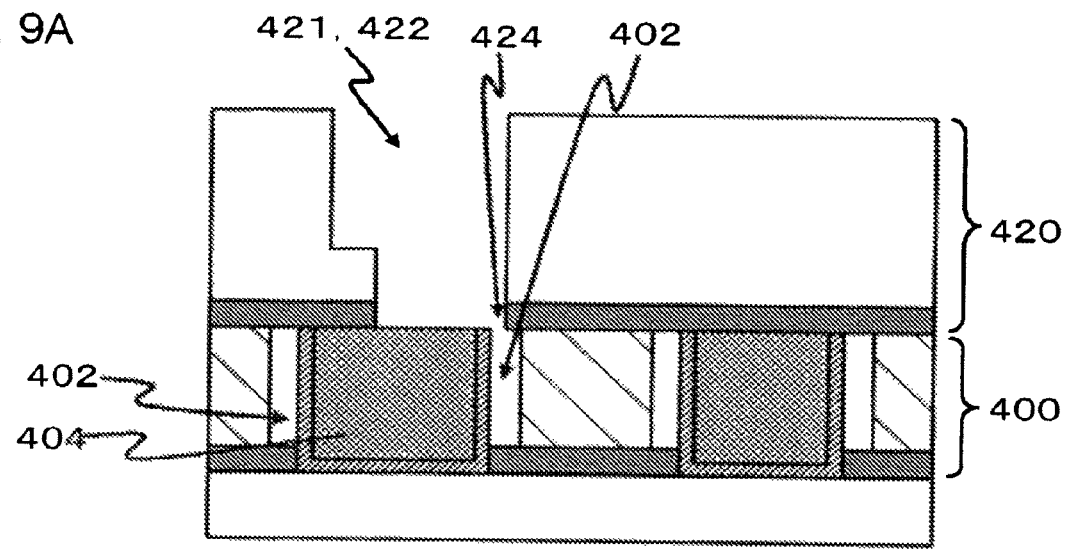
FIGS. 9A and 9B are cross-sectional views illustrating problems when a connection hole and an air gap are connected to each other.
Figure 9B:
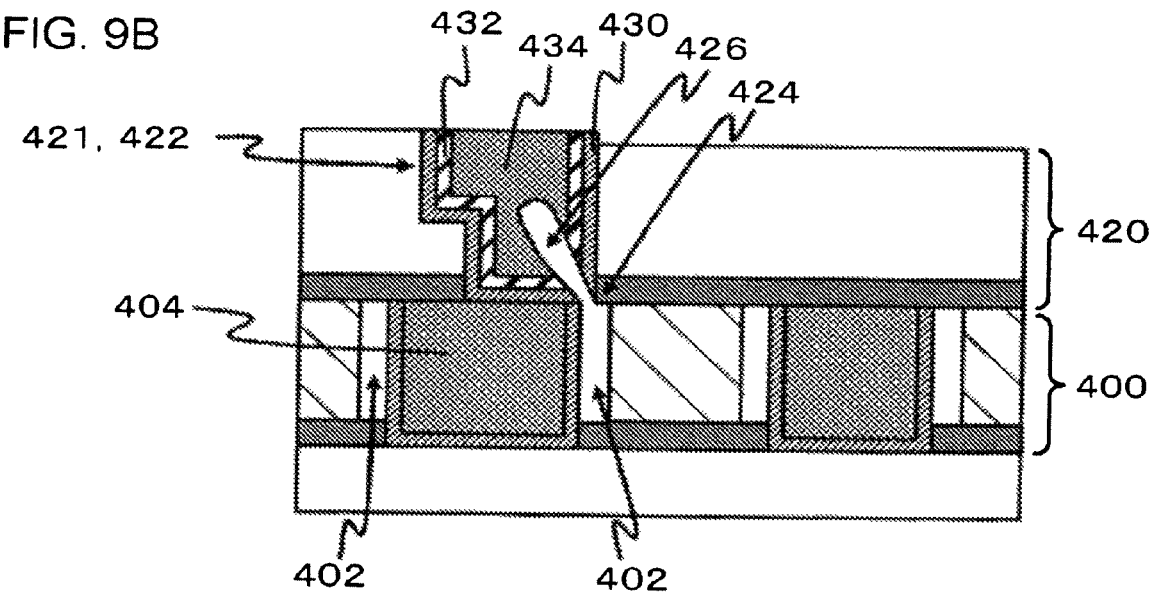

FIGS. 6A to 8 are cross-sectional views illustrating a method of manufacturing a semiconductor device according to a second embodiment. As shown in FIG. 8, the semiconductor device manufactured by the method has the same structure as the semiconductor device according to the first embodiment except that a metal cap film 164 is provided on the interconnect 162. The metal cap film 164 is, for example, a CoWP film. Alternatively, the metal cap film 164 may be a CoWB film or a film plated with a Ni-based material.

Figure 6A:
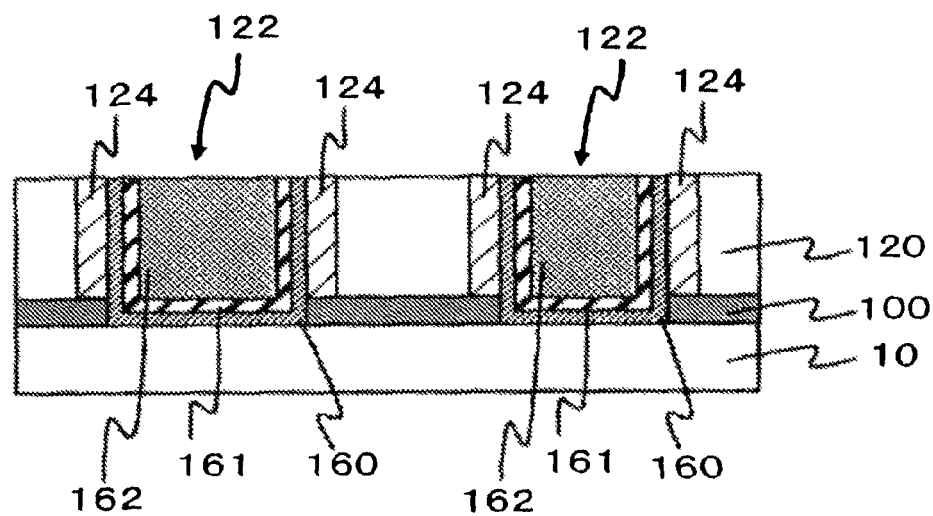
FIGS. 6A and 6B are cross-sectional views illustrating a method of manufacturing a semiconductor device according to a second embodiment of the invention.

First, as shown in FIG. 6A, the etching stopper film 100, the first insulating layer 120, the trenchs 122, the first damaged layer 124, the diffusion barrier metal film 160, the seed film 161, and the interconnects 162 are formed on the underlying insulating film 10. A process of forming the components is the same as that in the first embodiment.

Figure 6B:
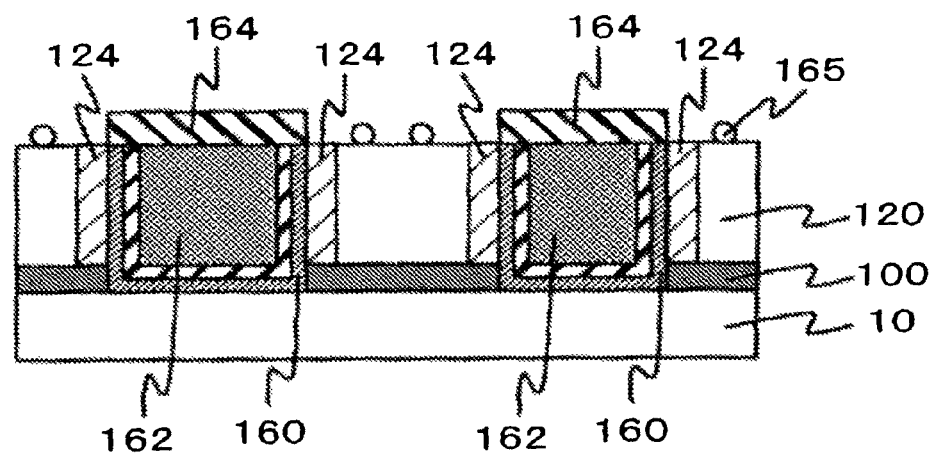

Then, as shown in FIG. 6B, the metal cap film 164 is selectively formed on the interconnect 162 by an electroless plating method. In this process, a deposit 165 is inevitably formed on the first insulating layer 120. The metal cap film 164 may be formed by a selective CVD method. In this case, the metal cap film 164 may be made of W or Co. Alternatively, the metal cap film 164 may be made of at least one selected from Si, Ag, Mg, Be, Zn, Pd, Cd, Au, Hg, Pt, Zr, Ti, Sn, Ni, and Fe.

Then, as shown in FIG. 7A, the second damaged layer 126 is formed on the surface of the first insulating layer 120. A method of forming the second damaged layer 126 is the same as that in the first embodiment.

Then, as shown in FIG. 7B, the first damaged layer 124 and the second damaged layer 126 are removed. A method of removing the layers is the same as that in the first embodiment. In this process, the deposit 165 is removed together with the second damaged layer 126.

Then, as shown in FIG. 8, the etching stopper film 200, the second insulating layer 220, the connection hole 221, the trench 222, the diffusion barrier metal film 260, the seed film 261, the via 262, and the interconnect 264 are formed. A method of forming the components is the same as that in the first embodiment. However, in this embodiment, the diffusion barrier metal film 260 is not a multi-layer film of a TaN film and a Ta film laminated in this order, but it may be, for example, a SiCH film.

According to this embodiment, it is also possible to obtain the same effects as those in the first embodiment. Since the etching stopper film 200 is formed after the metal cap film 164 is formed on the interconnect 162, the thickness of the portion 202 that is disposed over the air gap 128 is more than that of another portion that is disposed over the interconnect 162 in the etching stopper film 200. Therefore, even when the connection hole 221 overlaps the air gap 128 in a plan view, the etching stopper film disposed over the air gap is removed at the same time when the etching stopper film disposed on the bottom of the connection hole is removed. As a result, it is possible to prevent the connection between the air gap and the connection hole.

Since the metal cap film 164 is formed on the interconnect 162, the electromigration resistance of the interconnect 162 is improved. In addition, since the metal cap film 164 also serves as a diffusion barrier metal film of the interconnect 162, it is possible to use a SiCH film with a low dielectric constant as the diffusion barrier metal film 260.

The embodiments of the invention have been described with reference to the drawings, but the invention is not limited thereto. Various structures other than the above may be used.

It is apparent that the present invention is not limited to the above embodiment, and may be damaged and changed without departing from the scope and spirit of the invention.

What is claimed is:

1. A method of manufacturing a semiconductor device, said method comprising: forming a first insulating layer; forming a trench in said first insulating layer; forming an interconnect in said trench; forming a space between said first insulating layer and said interconnect, and disposing an upper surface of said interconnect at a position higher than an upper surface of said first insulating layer; forming a first damaged layer changed from said first insulating layer over a side wall of said trench in said forming said trench; forming a second damaged layer changed from said first insulating layer over a surface of said first insulating layer between said forming said interconnect, and said forming said space and disposing said upper surface of said interconnect; forming an air gap in said space and forming an etching stopper film over said first insulating layer and said interconnect; forming a second insulating layer over said etching stopper film; forming a via in said second insulating layer to be disposed over said interconnect; and forming a metal cap film over said interconnect after said forming said interconnect and before said forming said etching stopper film and said air gap, wherein, in said forming said etching stopper film and said air gap, said etching stopper film is formed over said metal cap film.

2. The method of manufacturing a semiconductor device according to claim 1, wherein, in said forming said air gap and said etching stopper film, said air gap is formed by said etching stopper film.

3. The method of manufacturing a semiconductor device according to claim 1, wherein said forming said via includes:
    forming a connection hole in said second insulating layer;
    forming a diffusion barrier metal film over a bottom and a side wall of said connection hole;
    forming a seed film over said diffusion barrier metal film; and
    performing a plating process using said seed film to form a conductive film in said connection hole.

4. The method of manufacturing a semiconductor device according to claim 1, wherein said forming said metal cap film comprises one of an electroless plating method and a selective chemical vapor deposition (CVD) method.

5. The method of claim 1, wherein said second damaged layer is formed at a position higher than said upper surface of said first insulating layer.

6. The method of claim 5, wherein, in said forming said space between said first insulating layer and said interconnect, and disposing said upper surface of said interconnect at the position higher than said upper surface of said first insulating layer, at least one of said first damaged layer and said second damaged layer are removed.

7. A method of manufacturing a semiconductor device, said method comprising:
  forming a first insulating layer;
  forming a trench in said first insulating layer;
  forming an interconnect in said trench;
  forming a space between said first insulating layer and said interconnect, and disposing an upper surface of said interconnect at a position higher than an upper surface of said first insulating layer;
  forming an air gap in said space and forming an etching stopper film over said first insulating layer and said interconnect;
  forming a second insulating layer over said etching stopper film;
  forming a via in said second insulating layer to be disposed over said interconnect;
  forming a first damaged layer changed from said first insulating layer over a side wall of said trench in said forming said trench; and
  forming a second damaged layer changed from said first insulating layer over a surface of said first insulating layer between said forming said interconnect, and said forming said space and disposing said upper surface of said interconnect at a position higher than said upper surface of said first insulating layer,
  wherein, in said forming said space between said first insulating layer and said interconnect, and disposing said upper surface of said interconnect at the position higher than said upper surface of said first insulating layer, said first damaged layer and said second damaged layer are removed.

8. The method of manufacturing a semiconductor device according to claim 7, wherein said first insulating layer comprises one of a SiCOH film, a SiCOHN film, a porous film of said SiCOH film, and a porous film of said SiCOHN film, and
  wherein each of said first damaged layer and said second damaged layer comprises a low carbon layer generated by a reduction in a carbon concentration of said first insulating layer.

9. The method of manufacturing a semiconductor device according to claim 8, wherein, in said forming said second damaged layer, said first insulating layer is processed by a plasma that includes hydrogen.

10. The method of manufacturing a semiconductor device according to claim 7, further comprising:
  forming a metal cap film over said interconnect after said forming said interconnect and before said forming said etching stopper film and said air gap,
  wherein, in said forming said etching stopper film and said air gap, said etching stopper film is formed over said metal cap film.

11. A method of manufacturing a semiconductor device, said method comprising:
  forming a first insulating layer;
  forming a trench in said first insulating layer;
  forming an interconnect in said trench;
  forming a space between said first insulating layer and said interconnect, and disposing an upper surface of said interconnect at a position higher than an upper surface of said first insulating layer;
  forming an air gap in said space and forming an etching stopper film over said first insulating layer and said interconnect;
  forming a second insulating layer over said etching stopper film;
  forming a via in said second insulating layer to be disposed over said interconnect;
  forming a first damaged layer changed from said first insulating layer over a side wall of said trench in said forming said trench; and
  forming a second damaged layer changed from said first insulating layer over a surface of said first insulating layer between said forming said interconnect, and said forming said space and disposing said upper surface of said interconnect.

12. The method of claim 11, wherein said second damaged layer is formed at a position higher than said upper surface of said first insulating layer.

13. The method of claim 12, wherein, in said forming said space between said first insulating layer and said interconnect, and disposing said upper surface of said interconnect at the position higher than said upper surface of said first insulating layer, said first damaged layer and said second damaged layer are removed.

14. A method of manufacturing a semiconductor device, said method comprising: forming a first insulating layer; forming a trench in said first insulating layer; forming an interconnect in said trench; forming a space between said first insulating layer and said interconnect, and disposing an upper surface of said interconnect at a position higher than an upper surface of said first insulating layer; forming a first damaged layer changed from said first insulating layer over a side wall of said trench in said forming said trench; forming a second damaged layer changed from said first insulating layer over a surface of said first insulating layer between said forming said interconnect, and said forming said space and disposing said upper surface of said interconnect; forming an air gap in said space and forming an etching stopper film over said first insulating layer and said interconnect; forming a second insulating layer over said etching stopper film; forming a via in said second insulating layer to be disposed over said interconnect; and forming a metal cap film over said interconnect after said forming said interconnect and before said forming said etching stopper film and said air gap.

15. The method of claim 14, wherein, in said forming said etching stopper film and said air gap, said etching stopper film is formed over said metal cap film.

* * * * *